US011933823B1

(12) United States Patent
Raju et al.

(10) Patent No.: US 11,933,823 B1
(45) Date of Patent: Mar. 19, 2024

(54) METHODS AND APPARATUS TO COMPARE VOLTAGES

(71) Applicant: Texas Instruments Incorporated, Dallas, TX (US)

(72) Inventors: Veeramanikandan Raju, Bangalore (IN); Anand Kumar G, Bangalore (IN); Aravindhan Karuppiah, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/962,139

(22) Filed: Oct. 7, 2022

(51) Int. Cl.
*G01R 19/10* (2006.01)
*G01R 19/165* (2006.01)
*G01R 19/25* (2006.01)

(52) U.S. Cl.
CPC ....... *G01R 19/10* (2013.01); *G01R 19/16576* (2013.01); *G01R 19/2506* (2013.01)

(58) Field of Classification Search
CPC .............. G01R 19/10; G01R 19/16576; G01R 19/2506
See application file for complete search history.

(56) References Cited

U.S. PATENT DOCUMENTS

| | | | | |
|---|---|---|---|---|
| 2004/0148121 A1* | 7/2004 | de Obaldia | ............ | H04B 17/20 702/117 |
| 2006/0020412 A1* | 1/2006 | Bruensteiner | ...... | G01R 31/3171 702/117 |

OTHER PUBLICATIONS

Texas Instruments, "ADSxxx3 Dual, 1-MSPS, 16-, 14-, and 12-Bit, 4x2 or 2x2 Channel, Simultaneous Sampling Analog-to-Digital Converter," Product Manual for Model Nos. ADS8363, ADS7263, and ADS7223, Oct. 2010—Revised Sep. 2017, 58 pages.

Texas Instruments, "AMC3306M25 High-Precision, +250-mV Input, Reinforced Isolated Delta-Sigma Modulator With Integrated DC/DC Converter," Product Manual for Model No. AMC3306M25, May 2020—Revised Apr. 2021, 40 pages.

Texas Instruments, "OPAx3888 Precision, Zero-Drift, Zero-Crossover, True Rail-to-Rail, Input/Output Operational Amplifiers," Product Manual for Model Nos. OPA388, OPA2388, and OPA4388, Nov. 2016—Revised Jul. 2020, 46 pages.

(Continued)

*Primary Examiner* — Jermele M Hollington
*Assistant Examiner* — Zannatul Ferdous
(74) *Attorney, Agent, or Firm* — Mandy Barsilai Fernandez; Frank D. Cimino

(57) ABSTRACT

An example device includes an analog comparator circuitry having a first input configured to couple to an input voltage and a second input configured to couple to a reference voltage, the analog comparator circuitry configured to output a digital value corresponding to a difference between the input voltage and the reference voltage and output sampler circuitry configured to: produce a plurality of samples of the difference, and count the number of samples in which the input voltage is greater than the reference voltage. The example device also includes reference adaption circuitry configured to: determine, based on the count, whether to adjust the reference voltage; responsive to a determination to adjust the reference voltage, determine, based on the count, an amount of adjustment; and responsive to a determination not to adjust the reference voltage, provide an indication of the reference voltage to processor circuitry.

20 Claims, 9 Drawing Sheets

(56) References Cited

OTHER PUBLICATIONS

Texas Instruments, "TMS320F28004x Microcontrollers," Product Manual for Model Nos. TMS320F280049, TMS320F280049C, TMS320F280048, TMS320F280048C, TMS320F280045, TMS320F280041, TMS320F280041C, TMS320F280040, and TMS320F280040C, Jan. 2017—Revised Feb. 2021, 230 pages.

* cited by examiner

METHODS AND APPARATUS TO COMPARE VOLTAGES

TECHNICAL FIELD

This description relates generally to anomalies, and more particularly to methods and apparatus to compare voltages.

BACKGROUND

In electrical systems, anomalies may refer to when the amplitude or frequency of a signal is different from one or more expected values of the signal. Anomalies may occur in a wide variety of electrical systems, including those found in industrial, commercial, and household environments. As such, the cause and severity of anomalies may depend on the application. The ability to detect anomalies through amplitude and frequency checks may enable reliable operation, functional safety, and predictive maintenance in any type of electrical system.

SUMMARY

For methods and apparatus to compare voltages, an example device includes an analog comparator circuitry having a first input configured to couple to an input voltage and a second input configured to couple to a reference voltage, the analog comparator circuitry configured to output a digital value corresponding to a difference between the input voltage and the reference voltage and output sampler circuitry configured to: produce a plurality of samples of the difference, and count the number of samples in which the input voltage is greater than the reference voltage. The example apparatus also includes reference adaption circuitry configured to: determine, based on the count, whether to adjust the reference voltage; responsive to a determination to adjust the reference voltage, determine, based on the count, an amount of adjustment; and responsive to a determination not to adjust the reference voltage, provide the reference voltage to processor circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
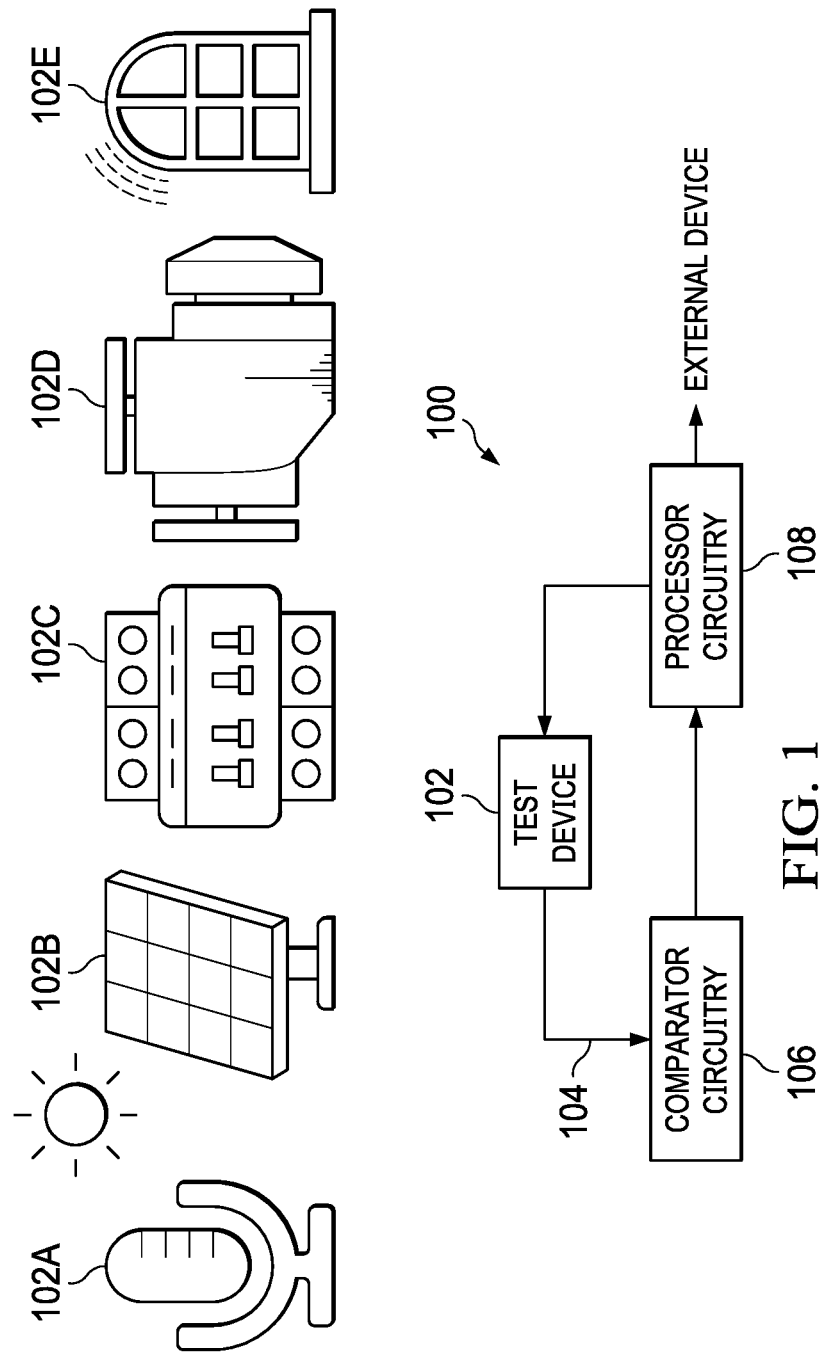
FIG. 1 is an example block diagram of a compute device.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Detecting anomalies in electrical systems can be a technical challenge. In some examples, an anomaly may be characterized by a voltage or frequency variation that is magnitudes smaller than a nominal voltage or frequency measurement. For example, a direct current (DC) arc in a solar panel may be considered an anomaly that requires detection. In some examples, however, the amplitude of the DC arc can be in the same range as a nominal current input. Additionally, the frequencies of the DC arc may overlap with the nominal switching frequencies in the current input. Furthermore, some anomalies may occur over extended periods, requiring measurements and pattern analysis for an extended amount of time to enable detection.

Some previous solutions to detect anomalies in electrical systems rely on the use of a high-resolution Analog to Digital Converter (ADC) to produce digital samples of an analog input voltage. Such previous solutions may implement signal processing techniques such as a Fast Fourier Transform (FFT) to calculate amplitude and frequency characteristics of the digital samples, and to detect anomalies based on the characteristics. While the use of a high-resolution ADC to produce digital samples and the use of complex signal processing techniques may detect anomalies, such a method offered by previous solutions may consume more power, require more time, and incur higher implementation costs than examples described herein. Some previous solutions to detect anomalies may be implemented at least in part by Successive Approximation Register (SAR) ADCs.

For example, in some previous solutions, a 16-bit SAR ADC within an integrated circuit may cost approximately 2 cents and require approximately 500,000 square micrometers ($\mu m^2$) of die space to implement. In contrast, example comparator circuitry described herein, which detects electrical anomalies according to the teachings of this disclosure, may cost approximately 0.2 cents and require approximately 20,000 $\mu m^2$ of die space to implement.

In some previous solutions, SAR ADC based signal processing may require approximately 15 milliwatts (mW) of power to detect anomalies due to the solution's continuously active signal chains and FFT computations. In contrast, the example comparator circuitry described herein may require approximately 75 microwatts ($\mu W$) of power to detect anomalies.

In some previous solutions, the time between an anomaly's occurrence and detection may be limited by the time required for the ADC to gather data. For example, some high-resolution ADCs may be able to sample a signal once every 4 microseconds ($\mu s$). In contrast, the example comparator circuitry described herein may sample a signal once every 20 nanoseconds (ns). This difference in sample time may be compounded over thousands of samples, or more, for a given anomaly detection.

Other previous solutions to detect anomalies may use an analog voltage comparator rather than a high-resolution ADC. Such previous solutions may compare the analog input voltage to a fixed reference voltage to detect amplitude-based anomalies. However, such previous solutions may be inadequate and/or unreliable in detecting frequency-based anomalies. In a frequency-based anomaly, the amplitude of the anomaly may be comparable to the nominal amplitude of the signal, but the frequency of the signal may differ from nominal values. Examples of anomalies that may not be reliably detected by such previous solutions include but are not limited to a DC arc.

Example methods, apparatus and articles of manufacture describe both amplitude-based anomaly detection without the use of an ADC and frequency-based anomaly detection that does not require specialized signal processing techniques such as an FFT. As such, examples implemented according to the teachings of this disclosure may detect both amplitude-based and frequency-based anomalies using less cost, less power, and/or less time than previous solutions.

FIG. 1 is an example block diagram of a compute device. The example system 100 includes an example test device 102, an example input voltage signal 104, example comparator circuitry 106, and example processor circuitry 108. The example test device 102 may include or more of: an example microphone 102A, an example solar panel 102B, an example circuit breaker 102C, an example motor 102D, and/or an example glass break detection system 102E.

The example system 100 detects electrical anomalies according to the teachings of this disclosure. Within the system 100, the example test device 102 is a device that may exhibit an electrical anomaly. The example test device 102 may be implemented by any type of device and may exhibit any type of electrical anomaly. For example, the test device 102 may be implemented by, but is not limited to, the example microphone 102A, the example solar panel 102B, the example circuit breaker 102C, the example motor 102D, the example glass break detection system 102E, etc. In some examples, such as the microphone 102A or glass break detection system 102E, an anomaly may be an audio pattern. In other examples, such as the motor 102D, an anomaly may be a vibration pattern. In still other examples, such as the solar panel 102B or the circuit breaker 102C, an anomaly may be an AC or DC voltage arc. In some examples, the test device 102 may be implemented by a different type of device not illustrated in FIG. 1.

The example test device 102 produces an input voltage signal 104 that changes due to electrical anomalies. For example, the input voltage signal 104 of the microphone 102A and/or glass break detection system 102E may represent the audible intensity, in decibels or other appropriate units, recorded by the test device 102 over time. In another example, the input voltage signal 104 of the motor 102D may characterize the vibration of the motor over time. In other examples, the input voltage signal 104 of the solar panel 102B and the circuit breaker 102C may represent the voltage across a particular cell or trip switch, respectively.

The example comparator circuitry 106 obtains the input voltage signal 104 from the test device 102. The example comparator circuitry 106 characterizes the amplitude and frequency characteristics of the example input voltage signal 104 according to the teachings of this disclosure. The example comparator circuitry 106 is discussed further in connection with FIGS. 2-4.

The example processor circuitry 108 uses the amplitude and frequency characteristics produced by the example comparator circuitry 106 to determine whether the example test device 102 exhibited an anomaly. The example processor circuitry 108 may use any technique based on the output of the example comparator circuitry 106 to determine whether the test device 102 exhibited an anomaly. Example techniques for analyzing the output of the example comparator circuitry 106 are discussed further in connection with FIGS. 4 and 7.

In some examples, the processor circuitry 108 may cause a device to perform an action after determining whether the example test device 102 exhibited an anomaly. The example processor circuitry may cause any type of action for any purpose, including to ensure safety and reliable performance of the example test device 102. For example, if the processor circuitry 108 determines the motor 102D experienced a vibration anomaly, the example processor circuitry 108 may reduce an operating speed of the motor 102D to remove the motor 102D from an unsafe operating state. In another example, after determining the microphone 102A measured a specific audio pattern referred to as an anomaly, the example processor circuitry 108 may send instructions to a connected Internet of Things (IoT) device to turn on a light, switch a television channel, change a temperature in a room, etc. In another example, after determining the glass break detection system 102E experienced an audio anomaly that corresponds to the sound of breaking glass, the example processor circuitry may notify an alarm or security system.

The example processor circuitry 108 may be implemented by any type of processor circuitry. Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). While FIG. 1 illustrates the example comparator circuitry 106 and example processor circuitry 108 separately from the example test device 102, in some examples, a test device 102 implemented in accordance with the teachings of this disclosure may include comparator circuitry 106 functionality and/or and processor circuitry 108 functionality.

In the example system 100, the example comparator circuitry 106 characterizes the input voltage signal 104 from the test device 102 so that the processor circuitry 108 can detect anomalies and optionally cause an action based on the detection. Advantageously, the example comparator circuitry 106 provides amplitude characteristics to the processor circuitry 108 without the use of a high-resolution ADC. The example comparator circuitry 106 also provides frequency characteristics to the processor circuitry 108 without specialized signal processing techniques such as an FFT. As such, the example system 100 may detect both amplitude-based and frequency-based anomalies using less cost, less power, and/or less time than previous solutions.

Figure 2:
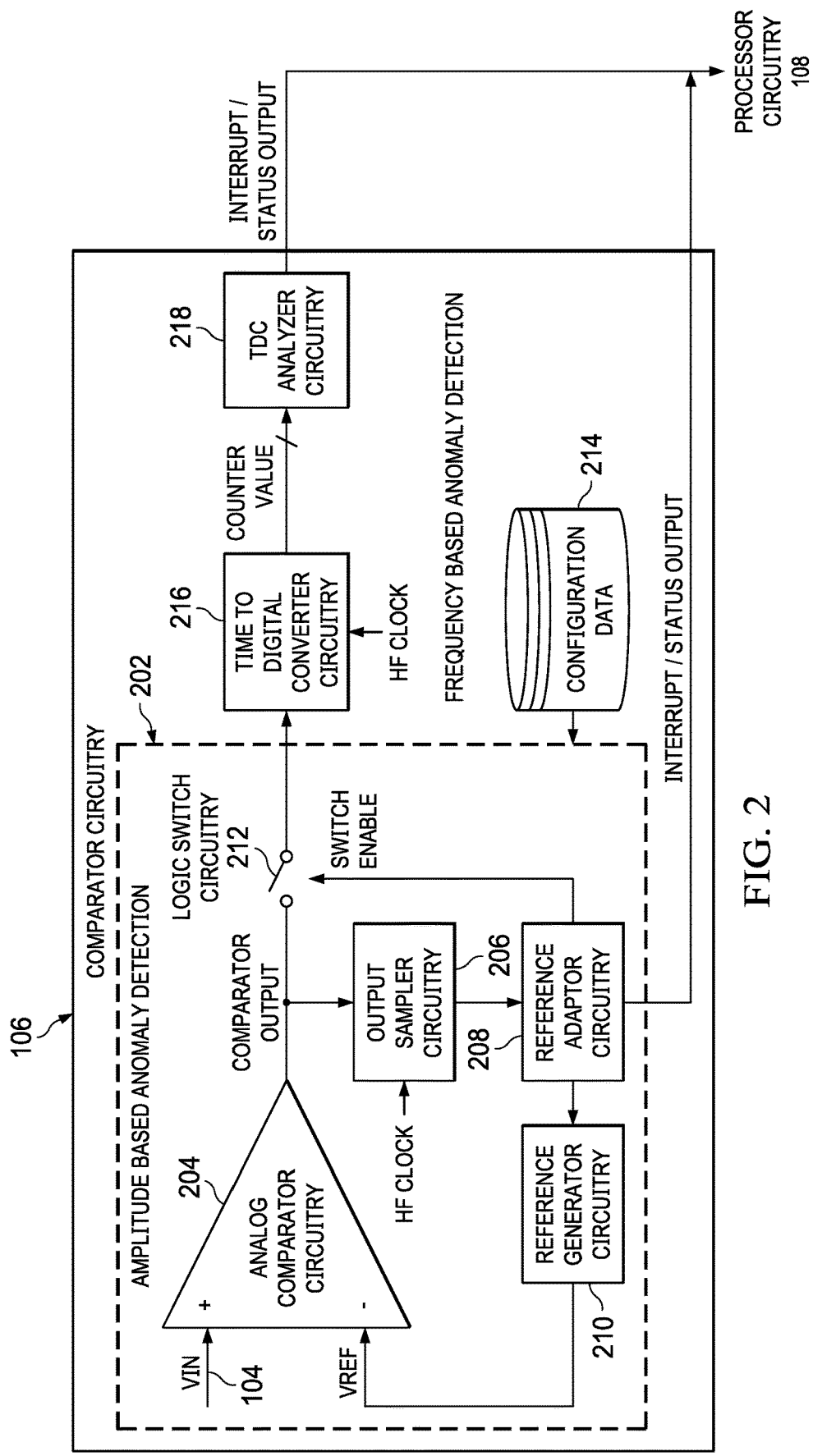
FIG. 2 is an example block diagram of the comparator circuitry of FIG. 1.

FIG. 2 is an example block diagram of the comparator circuitry of FIG. 1. FIG. 2 includes example amplitude analysis circuitry 202. The example amplitude analysis circuitry 202 includes an example analog comparator circuitry 204, example output sampler circuitry 206, example reference adaptor circuitry 208, example reference generator circuitry 210, and example logic switch circuitry 212. FIG. 2 also includes example configuration data 214, example Time to Digital Converter (TDC) circuitry 216, and example TDC analyzer circuitry 218.

The example amplitude analysis circuitry 202 characterizes the amplitude of the input voltage signal 104 according to the teachings of this disclosure. Within the example amplitude analysis circuitry 202, the example analog comparator circuitry 204 compares the input voltage signal 104 to a reference voltage signal. In examples disclosed herein, if the amplitude of the input voltage signal 104 is greater than the reference voltage, the example analog comparator circuitry 204 may produce a high supply voltage representative of a logical '1'. In contrast, if the amplitude of the input voltage signal 104 is less than or equal to the reference voltage, the example analog comparator circuitry 204 may produce a low supply voltage representative of a logical '0'. The example analog comparator circuitry 204 may output a continuous signal that includes either a logical '1' or a logical '0' based on how the input voltage signal 104 relates to the current reference voltage at any point in time. As used herein, the output of the example analog comparator circuitry 204 may be referred to as a comparator output signal or a comparator signal.

In other examples, the example analog comparator circuitry 204 may produce the same outputs under different conditions. In such examples, the example analog comparator circuitry 204 may produce a logical '0' when the amplitude of the input voltage signal 104 is greater than the reference voltage and may produce a logical '1' when the amplitude of the input voltage signal 104 is less than or equal to the reference voltage.

The example output sampler circuitry 206 samples the output of the example analog comparator circuitry 204. Specifically, the example output sampler circuitry 206 samples the output at a predetermined frequency. The example output sampler circuitry 206 also counts the number of samples where the input voltage signal 104 is greater than the reference voltage. To do so, the example output sampler circuitry 206 increments a counter for each sample of a high supply voltage (i.e., of a logical '1'). The example output sampler circuitry 206 resets the counter at the end of each sample window. As used herein, a sample window refers to a configurable number of consecutive samples taken by the example output sampler circuitry 206. In examples used herein, the number of ones within a given sample window may be referred to as a ones counter. The example output sampler circuitry 206 is discussed further in connection with FIG. 3.

The example reference adaptor circuitry 208 determines whether the number of samples in the sample window with a high supply voltage satisfies a configurable threshold. The configurable threshold may refer to any range of values. For example, the threshold may refer to 40%-60% of the total number of samples in the window. In such an example, if the sample window included 100 samples, the reference adaptor circuitry 208 would determine the number of samples in the sample window with a high supply voltage satisfies the threshold if the ones counter is any value between 40 and 60. The example output sampler circuitry 206 is discussed further in connection with FIG. 3.

If the example reference adaptor circuitry 208 determines the number of samples with a high supply voltage in the sample window does not satisfy the configurable threshold, the example reference adaptor circuitry 208 determines an adjustment to the reference voltage based on the ones counter. For example, suppose the configurable threshold required 40%-60%, inclusive, of the total number of samples in the window to be a high supply voltage. If the ones counter is between 0% and 39%, the example reference adaptor circuitry 208 may decrease the reference voltage by a first amount. If the ones counter is between 61% and 100% of the samples in the sample window, however, the example reference adaptor circuitry 208 may increase the reference voltage by a second amount. The example reference adaptor circuitry 208 may increase the reference voltage independent of any decrease to the reference voltage such that the first amount and second amount are not based upon one another. The example reference adaptor circuitry 208 is discussed further in connection with FIG. 3.

If the example reference adaptor circuitry 208 determines the number of samples with a high supply voltage in a sample window does satisfy the configurable threshold, the example reference adaptor circuitry 208 may send an enable signal to the logic switch circuitry 212. In contrast, the example reference adaptor circuitry 208 may send a disable signal to the example logic switch circuitry 212 after determining the number of samples with a high supply voltage does not satisfy the configurable threshold. The example reference adaptor circuitry 208 may notify the processor circuitry 108 when transitioning from an enable signal to a disable signal or vice versa. In some examples, the notification may be implemented by an interrupt, a status output, or any other appropriate indication technique.

If the example reference adaptor circuitry 208 determines the number of samples with a high supply voltage in a sample window does not satisfy the configurable threshold, the example reference generator circuitry 210 generates a new reference voltage based on the amplitude adjustments provided by the reference adaptor circuitry 208. For example, suppose a first reference voltage used by the analog comparator circuitry 204 in a first sample window was 100 mV, and that, in response to the ones counter from the first sample window, the example reference adaptor circuitry provided instructions to the example reference generator circuitry to increase the reference voltage by 25 mV. In such examples, the reference generator circuitry 210 would produce a second reference voltage of 125 mV for use during a second sample window. Suppose further that the example reference adaptor circuitry 208 uses the ones counter from the second sample window as a basis to decrease the reference voltage by 12.5 mV. In such examples, the reference generator circuitry 210 would produce a third reference voltage of 112.5 mV for use during a third sample window. The example reference generator circuitry 210 may use any technique to generate a reference voltage. The example reference generator circuitry 210 is discussed further in connection with FIG. 3.

The example logic switch circuitry 212 may operate in either an enabled or a disabled state. In the enabled state, the example logic switch circuitry 212 may permit the example TDC circuitry 216 to access the comparator output signal. In the disabled state, the example logic switch circuitry 212 may prevent the TDC circuitry 216 from accessing the comparator output signal. The example logic switch circuitry 212 may transition between the enabled and disabled state based on instructions from the example reference adaptor circuitry 208. The example logic switch circuitry 212 may be implemented by any type of hardware or software switch. In some examples, the logic switch circuitry 212 may be referred to as a gate.

The example configuration data 214 stores information that describes how the example amplitude analysis circuitry 202 is configured to operate. For example, the configuration data 214 may store the amount of time between samples, the number of samples in a sample period, the amount to increase a reference voltage by, the amount to decrease a voltage by, etc. Information within the example configuration data 214 may be provided by a manufacturer or user prior to operation of the example comparator circuitry 106. The example configuration data 214 may be implemented by one or more registers of an internal memory.

The example configuration data 214 is implemented by any memory, storage device and/or storage disc for storing data such as, for example, flash memory, magnetic media, optical media, solid state memory, hard drive(s), thumb drive(s), etc. Furthermore, the data stored in the example configuration data 214 may be in any data format such as, for example, binary data, comma delimited data, tab delimited data, structured query language (SQL) structures, etc. While, in the illustrated example, the example configuration data 214 is illustrated as a single device, the example configuration data 214 and/or any other data storage devices described herein may be implemented by any number and/or type(s) of memories. The example configuration data 214 may be discussed further in connection with FIG. 3.

The example TDC circuitry 216 increments a TDC counter when both the logic switch circuitry 212 is in the enabled state and the comparator output signal is at or near a high supply voltage representative of a logical '1'. The example TDC circuitry 216 may increment the TDC counter at a rate based on a high frequency (HF) clock. The example TDC circuitry 216 continues to increment TDC counter value until either the example logic switch circuitry 212 transitions to the disabled state or the comparator output signal is at or near a low supply voltage representative of a digital '0'. Unlike the ones counter of the example output sampler circuitry 206, the TDC counter value may exceed the number of samples in a sample window, provided the example reference adaptor circuitry 208 keeps the logic switch circuitry 212 in the enabled state and the input voltage signal 104 remains greater than the reference voltage for consecutive sample windows. The example TDC circuitry 216 is discussed further in connection with FIG. 4.

When the example reference adaptor circuitry 208 changes the logic switch circuitry 212 from an enabled to a disabled state, the example TDC circuitry 216 stops counting and provides the value to the example TDC analyzer circuitry 218. The example TDC analyzer circuitry 218 then compares the TDC count to various ranges of values to determine which range the TDC count fits within. The example TDC analyzer circuitry 218 notifies the example processor circuitry 108 to provide which range of values contained the TDC count. In some examples, the notification may be in implemented as an interrupt, a status output, or any other appropriate indication technique. The example TDC analyzer circuitry 218 is discussed further in connection with FIG. 4.

FIG. 2 illustrates how the example comparator circuitry 106 characterizes the amplitude and frequency of the example input voltage signal 104. Advantageously, the example comparator circuitry 106 includes example reference adaptor circuitry 208 to change the reference voltage based on the input voltage signal 104. As a result, the reference voltage can be continuously updated to reflect a normal operating amplitude of the input voltage signal 104, even when the input voltage signal 104 transitions from a first nominal amplitude to a second nominal amplitude. Furthermore, the example comparator circuitry 106 includes TDC circuitry 216 to determine an amount of time (implemented as a number of samples recorded at regular intervals) that the input voltage signal 104 continuously stays above a reference voltage by a nominal amount. Such timing information characterizes the frequency of the input voltage signal 104. Advantageously, the comparator circuitry 106 can be implemented through simple logic circuits that provide a fast, low power, and low-cost solution manner to enable the detection of anomalies in electrical systems.

Figure 3:
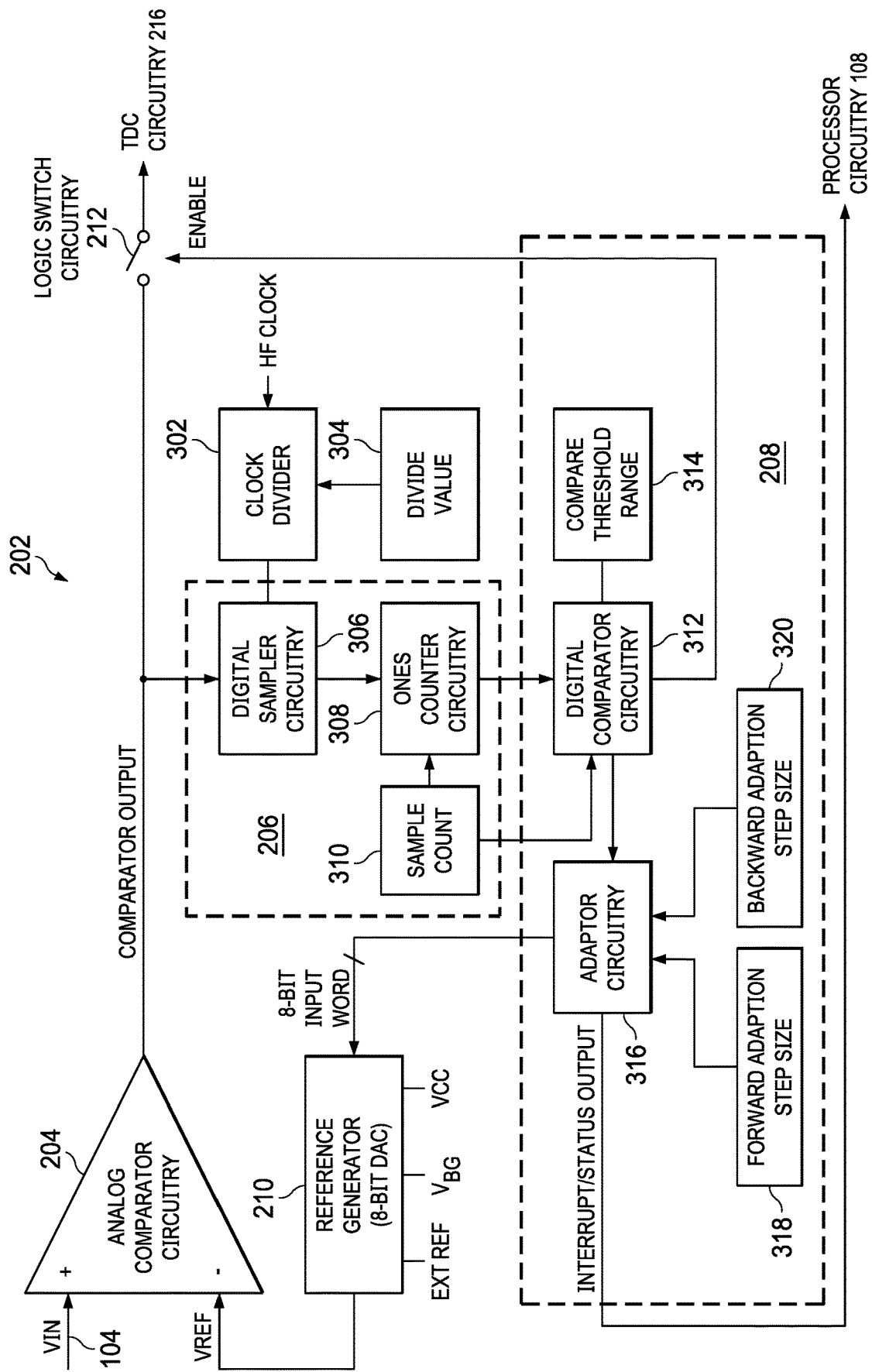
FIG. 3 is an example block diagram of a portion of the comparator circuitry of FIG. 1.

FIG. 3 is an example block diagram of a portion of the comparator circuitry 106 of FIG. 1. Specifically, FIG. 3 describes the example amplitude analysis circuitry 202 in additional detail. FIG. 3 includes the example analog comparator circuitry 204, the example output sampler circuitry 206, the example reference adaptor circuitry 208, the example reference generator circuitry 210, example clock divider circuitry 302, and example divide value 304. The example output sampler circuitry 206 includes example digital sampler circuitry 306, example ones counter circuitry 308, and an example sample count 310. The example reference adaptor circuitry 208 includes example digital comparator circuitry 312, an example comparison threshold range 314, example adaptor circuitry 316, example forward adaption step size 318, and example backward adaption step size 320.

The example clock divider circuitry 302 divides a high frequency clock by the example divide value 304. The high frequency clock may be a system level signal that is produced by external clock circuitry and provided to the example amplitude analysis circuitry 202. The example divide value 304 is a value that is stored in the example configuration data 214 and may be determined by a manufacturer or user of the example comparator circuitry 106. The example clock divider circuitry 302 may divide the high frequency clock by the example divide value 304 to generate an application specific frequency for use by the example digital sampler circuitry 306.

The example digital sampler circuitry 306 samples the output of the example analog comparator circuitry 204. Specifically, the example digital sampler circuitry samples the output at a rate provided by the clock divider circuitry 302. The digital sampler circuitry 306 may output a logical '1' bit when the comparator output signal is at a high supply voltage. Similarly, the digital sampler circuitry 306 may output a logical '0' bit when the comparator output signal is at a low supply voltage.

The example ones counter circuitry 308 counts the number of logical '1' bits produced by the example digital sampler circuitry 306 within a sample window. In some examples, the number of samples in a sample window may be referred to as a set. In such examples, the counting of ones by the example ones counter circuitry may be referred to as identifying a subset of samples that indicate the input voltage is greater than the reference voltage.

The example sample count 310 is a value that defines the number of samples within a sample window. The example ones counter circuitry 308 uses the sample count 310 to determine when to reset the ones counter to zero. For example, the ones counter circuitry 308 may provide the current ones counter value to the digital comparator circuitry 312 and subsequently reset the ones counter to zero every n samples, where n is the value of the sample count 310. The sample count 310 may be stored in the example configuration data 214 and may be determined by a manufacturer or user of the example comparator circuitry 106.

The example digital comparator circuitry 312 compares the number of samples in a sample window with a high supply voltage (i.e., the ones counter value) to the example comparison threshold range 314. The example comparison threshold range 314 may be implemented as an upper bound value and a lower bound value stored in the configuration data 214. In some examples, the comparison threshold range 314 may be stored as a percentage. In the foregoing example described in connection with FIG. 2, for instance, the comparison threshold range 314 had an upper bound of 60% of the sample count and had a lower bound of 40% of the sample count. In other examples, the comparison threshold range 314 may be stored differently.

In some examples, in response to a determination the ones counter value provided by the ones counter circuitry 308 is within the example comparison threshold range 314, the example digital comparator circuitry 312 may send an enable signal to the logic switch circuitry 212 and may not provide a notification to the example adaptor circuitry 316. In such examples, in response to a determination the ones counter value is not within the example comparison threshold range 314, the example digital comparator circuitry 312 may send a disable signal to the logic switch circuitry 212 and provide a notification to the example adaptor circuitry 316.

In other examples, the example digital comparator circuitry 312 may use a first set of conditions to determine when to cause the example logic switch circuitry 212 to transition from a disabled state to an enabled state but use a different, second set of conditions to determine when to cause the example logic switch circuitry 212 to transition from an enabled state to a disabled state. For example, the first set of conditions may cause the example digital comparator circuitry 312 to enable the logic switch circuitry 212 when the ones counter value from any one sample window satisfies the comparison threshold range 314. The second set of conditions may cause the example digital comparator circuitry 312 to disable the logic switch circuitry 212 when n consecutive ones counter values from consecutive sample windows each fail to satisfy the comparison threshold range 314. In such examples, n may be a configurable integer value stored in the example configuration data 214. The different sets of conditions used by the example digital comparator circuitry 312 may enable the logic switch circuitry 212 to lock into the enabled state and may enable the TDC circuitry 216 to characterize low frequency signals. An example of two different sets of conditions used by the example digital comparator circuitry 312 is discussed further in connection with FIG. 7.

In response to the notification from the example digital comparator circuitry 312, the example adaptor circuitry 316 selects either the forward adaption step size 318 or backward adaption step size 320. The example adaptor circuitry 316 may choose between the forward adaption step size 318 and the backward adaption step size 320 based on how the ones counter value compared to the upper and lower bounds of the example comparison threshold range 314. For example, if the notification indicates the ones value is greater than the upper bound of the example comparison threshold range 314, the example adaptor circuitry 316 may select the forward adaption step size 318. Similarly, if the notification indicates the ones value is less than the lower bound of the example comparison threshold range 314, the example adaptor circuitry 316 may select the backward adaption step size 320. The example forward adaption step size 318 and example backward adaption step size 320 may both be stored in the example configuration data 214 and may both be determined by a manufacturer or user of the example comparator circuitry 106.

The example reference generator circuitry 210 is implemented in FIG. 3 as an 8-bit Digital to Analog Converter (DAC). As a DAC, the example reference generator circuitry 210 may provide a reference voltage to the analog comparator circuitry 204 based on a supply voltage and an input value. The supply voltage may be obtained from any source. For example, in FIG. 3, the first the example reference generator circuitry 210 may obtain the supply voltage a compute resource external to the example comparator circuitry, from an internal band gap voltage, or from a voltage common collector (Vcc) signal that provides power to the example comparator circuitry 106. In some examples, the example reference generator circuitry 210 may implement a resistor ladder to generate intermediate voltages based on the supply voltage. The example reference generator circuitry 210 may select one of the intermediate voltages based on an input value obtained from the example adaptor circuitry 316. The example adaptor circuitry 316 may provide the input value based on the reference voltage of the previous sample window and the selected adaption step (either the forward adaption step size 318 or the backward adaption step size 320). As used above and herein, the reference voltage used by the example analog comparator circuitry 204 may refer to a particular intermediate voltage that the example reference generator circuitry 210 selects for a given sample window. In examples described herein, the input value provided the example reference generator circuitry 210 may be referred to a DAC code.

FIG. 3 provides additional detail of how the example amplitude analysis circuitry 202 of FIG. 2 may be implemented. Advantageously, the example output sampler circuitry 206, the example reference adaptor circuitry 208, and the example reference generator circuitry 210 may be implemented without a high-resolution ADC. As a result, the example comparator circuitry 106 may detect both amplitude-based anomalies using less time, less power, and less cost than previous implementations to do so. Furthermore, each of the example sample count 310, example comparison threshold range 314, example forward adaption step size 318, and example backward adaption step size 320 are stored in the configuration data 214 and may be set by a manufacturer or user to detect specific electrical anomalies based on the application.

Figure 4:
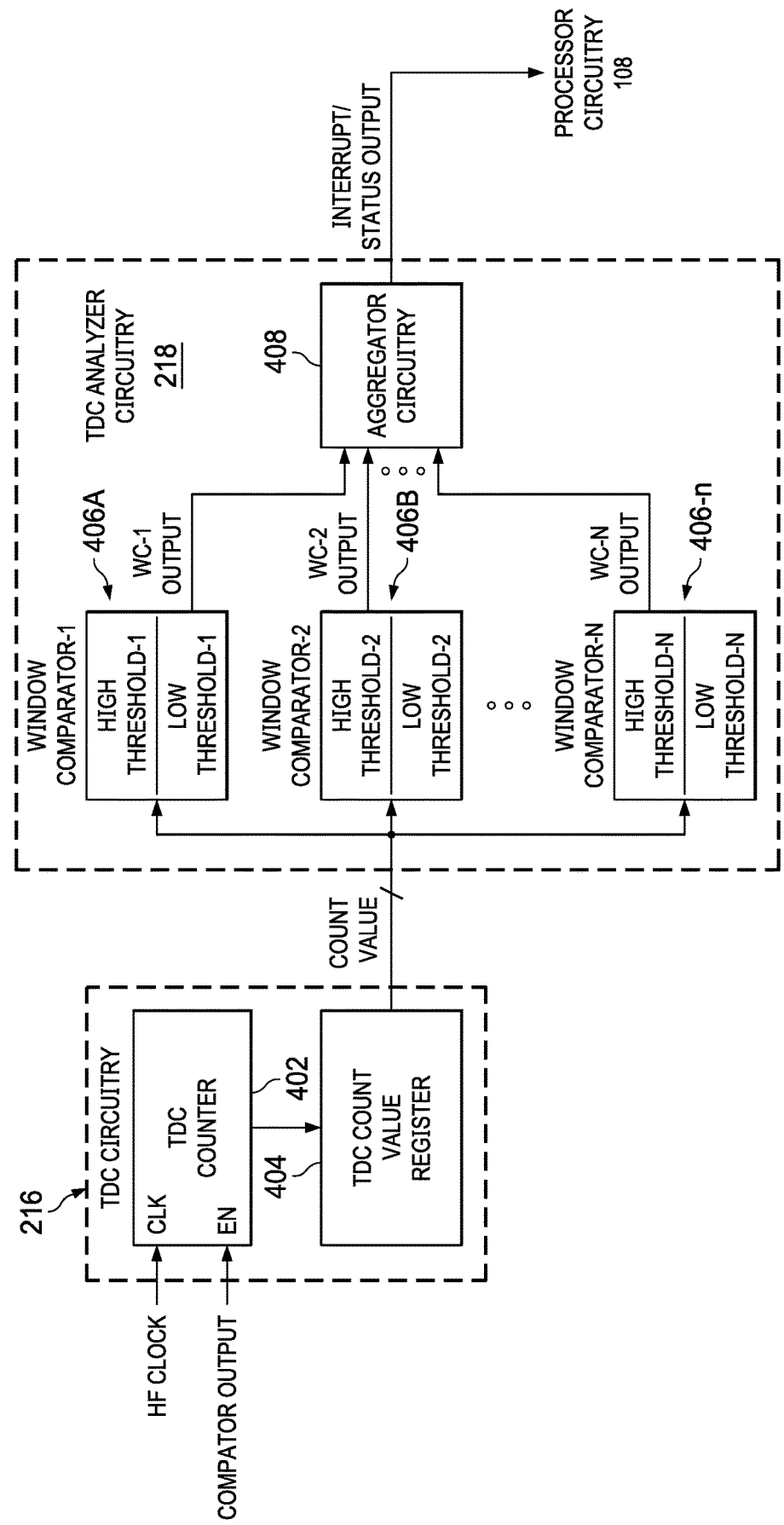
FIG. 4 is an example block diagram of the Time-To-Digital Converters (TDCs) and window comparators of FIG. 2.

FIG. 4 is an example block diagram of the example TDC circuitry 216 and TDC analyzer circuitry 218 of FIG. 2. The example TDC circuitry 216 includes example TDC counter circuitry 402 and an example TDC counter value register 404. The example TDC analyzer circuitry 218 includes example window comparator circuitry 406A, 406B, . . . , 406-n and example aggregator circuitry 408.

The example TDC counter circuitry 402 receives the comparator output signal from the example analog comparator circuitry 204 when the example logic switch circuitry 212 is in the enable state. Once the example logic switch circuitry 212 is enabled, the example TDC counter circuitry 402 repeatedly increments the TDC counter value whenever the comparator output signal is at a high supply voltage. Specifically, the example TDC counter circuitry 402 checks the value of the comparator output signal at a rate given by the HF clock. The example TDC counter circuitry 402 stops incrementing the TDC counter value when the comparator output signal transitions from a high supply voltage a low supply voltage. Once the comparator output signal is at a low supply voltage, the example TDC counter circuitry 402 may store the current TDC counter value in the TDC counter value register 404 and subsequently reset the TDC counter value to 0.

When the example logic switch circuitry 212 is in the disabled state, the example TDC counter circuitry 402 does not increment the TDC counter value. In some examples, the example comparator output signal may transition from between a high supply voltage and low supply voltage multiple times while the logic switch circuitry 212 is enabled. In such examples, the example TDC counter circuitry 402 may generate multiple separate TDC counter values before the logic switch circuitry 212 is disabled and counting stops.

The example window comparator circuitry 406A, 406B, ..., 406-n each define a range based on a configurable high threshold integer value and a configurable low threshold integer value. In some examples, a manufacturer or user may set configure the example window comparator circuitry 406A, 406B, ..., 406-n such that the high threshold integer value of window comparator circuitry 406A is adjacent to the low threshold value of window comparator circuitry 406B, the high threshold integer value of window comparator circuitry is adjacent to the low threshold value of window comparator circuitry 406C, etc. A given window comparator circuitry 406A may generate a high supply voltage (equivalent to digital logic 1) when the TDC counter value in the TDC counter value register 404 is within its range defined by the low threshold integer value and high threshold integer value. Similarly, the given window comparator circuitry 406A may generate a low supply voltage (equivalent to digital logic 0) when the TDC counter value in the TDC counter value register 404 is not within its range.

The example aggregator circuitry 408 receives the outputs of each window comparator circuitry 406A, 406B, ..., 406-n. The example aggregator circuitry 408 may notify the example processor circuitry 108 which window is producing a high supply voltage at any given time. In some examples, the notification may be implemented as an interrupt or a status update.

FIG. 4 illustrates how the example TDC analyzer circuitry 218 includes a plurality of example window comparator circuitry 406A, 406B, ..., 406-n instances to determine which set of thresholds accurately describe the amount of time in which both the example logic switch circuitry 212 was in an enabled state and the comparator output signal was at a high supply voltage. In doing so, the example comparator circuitry 106 may characterize the frequency of the input voltage signal 104 with less implementation cost, less power, and less time than previous solutions to do so.

Figure 5:
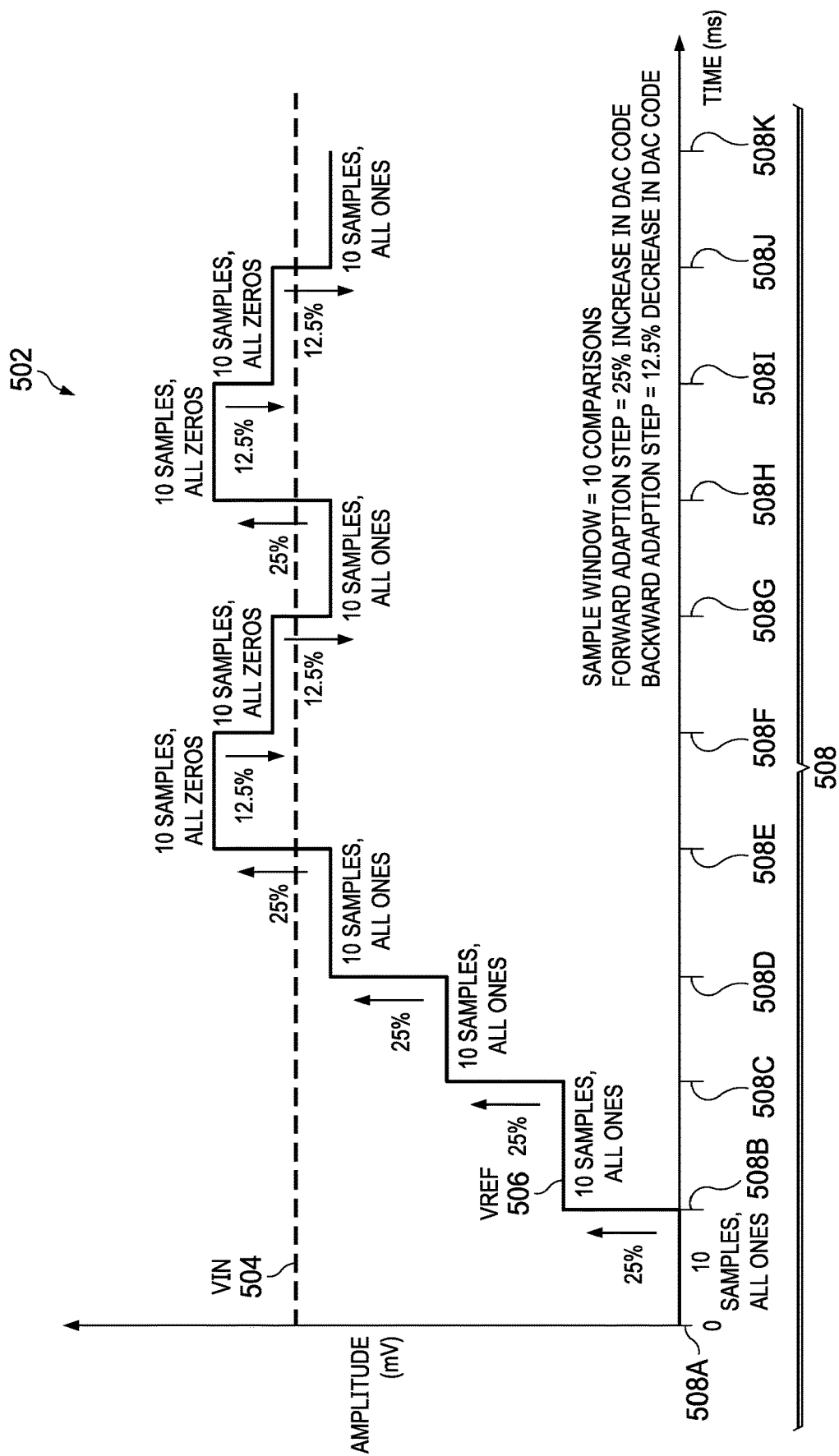
FIG. 5 is a first illustrative example of reference voltage adjustment by the comparator circuitry of FIG. 1.

FIG. 5 is a first illustrative example of reference voltage adjustment by the comparator circuitry of FIG. 1. FIG. 5 illustrates an example graph 502. The example graph 502 includes an example $V_{IN}$ signal 504, an example $V_{REF}$ signal 506, and example timestamps 508A, 508B, 508C, 508D, 508E, 508F, 508G, 508H, 508I, 508J, 508K, collectively referred to as example timestamps 508.

The example graph 502 represents time on the x axis. The x axis is segmented by the example timestamps 508. The example timestamps 508 represent the boundaries between sample windows. The duration of a sample window is determined by the example clock divider circuitry 302 and the example sample count 310. In the illustrative example of FIG. 5, a given sample window contains ten samples, for simplicity. In other examples, the sample count 310 may define a different and/or greater number of samples within a sample window. While the example graph 502 uses units of milliseconds (ms) on the x axis, in other examples, different units of time may be used. Similarly, while the example graph 502 uses units of millivolts (mV) to represent voltage on the y axis, in other examples, different units voltage may be used.

The $V_{IN}$ signal 504 is an example implementation of the input voltage signal 104. The example $V_{IN}$ signal 504 may be generated by any type of test device 102 for any application. In the illustrative example of FIG. 5, the $V_{IN}$ signal 504 is a DC signal with a voltage that does not change over time.

The $V_{REF}$ signal 506 is an example implementation of the reference voltage provided to the example analog comparator circuitry 204 by the example reference generator circuitry 210. The example graph 502 shows how the amplitude of the example $V_{REF}$ signal 506 changes over time.

FIG. 5 shows that, before operation of the example comparator circuitry 106, which may begin when the example comparator circuitry 106 first receives the $V_{IN}$ signal 504, a manufacturer or user may set an initial DAC code of zero and cause the reference generator circuitry 210 to output a reference voltage of zero millivolts. Because the amplitude of the $V_{IN}$ signal 504 is greater than zero millivolts, the example analog comparator circuitry 204 produces a high supply voltage during each sample taken in a first sample window (i.e., the time between timestamps 508A, 508B). Accordingly, the example adaptor circuitry 316 provides a DAC code to the example reference generator circuitry 210 by adding the example forward adaption step size 318 to the current DAC code. In the illustrative example of FIG. 5, the forward adaption step size 318 may refer to 25% of a maximum DAC code value. In other examples, the forward adaption step size 318 may refer to a different value.

The example reference generator circuitry 210 updates the example $V_{REF}$ signal 506 based on the provided DAC code. Accordingly, in the next sample window between example timestamps 508B, 508C, the amplitude of the example $V_{REF}$ signal 506 is greater than the amplitude between example timestamps 508A, 508B. However, because the amplitude of the example $V_{REF}$ signal 506 between example timestamps 508B, 508C is still less than the example $V_{IN}$ signal 504, all ten samples recorded during the sample window are again logical '1' values. As a result, the example adaptor circuitry 316 provides another DAC code to the example reference generator circuitry 210, causing the amplitude of the example $V_{REF}$ signal 506 to increase again. In the illustrative example of FIG. 5, the amplitude of the example $V_{REF}$ signal 506 is increased four times between timestamps 508A, 508E in a similar matter as described above.

Following timestamp 508E, the amplitude of the example $V_{IN}$ signal 504 is less than the example $V_{REF}$ signal 506. Accordingly, the example analog comparator circuitry 204 produces a low supply voltage during each sample taken in the corresponding sample window (i.e., the time between timestamps 508E, 508F). In turn, the example adaptor circuitry 316 provides a DAC code to the example reference generator circuitry 210 by subtracting the example backward adaption step size 320 to the current DAC code. In the illustrative example of FIG. 5, the backward adaption step size 320 may refer to 12.5% of a maximum DAC code value. In other examples, the backward adaption step size 320 may refer to a different value.

The example reference generator circuitry 210 decreases the amplitude of the example $V_{REF}$ signal 506 based on the updated code. In the illustrative example of FIG. 5, the comparator output represents a logical '0' during each of the ten samples recorded between example timestamps 508F, 508G. Accordingly, the comparator circuitry 108 decreases the amplitude of the example $V_{REF}$ signal 506 as described previously. As a result, the amplitude of example $V_{REF}$ signal 506 between timestamps 508G, 508H matches the amplitude between timestamps 508D, 508E.

FIG. 5 illustrates an example in which the amplitude of example $V_{REF}$ signal 506 may not be adjusted to exactly match a DC input voltage signal. Rather, as shown in FIG. 5, the example amplitude analysis circuitry 202 may repeatedly adjust the amplitude of the example $V_{REF}$ signal 506 such that the amplitude oscillates around the example $V_{IN}$ signal 504. As such, the example adaptor circuitry 316 may determine the example $V_{IN}$ signal 504 is static after a number of oscillations in which the same set of DAC codes are generated in a repeating pattern. In response to the determination, the example adaptor circuitry 316 may calculate the amplitude of the example $V_{IN}$ signal 504 using the set of repeating DAC codes and provide the calculated amplitude to the example processor circuitry 108.

Figure 6:
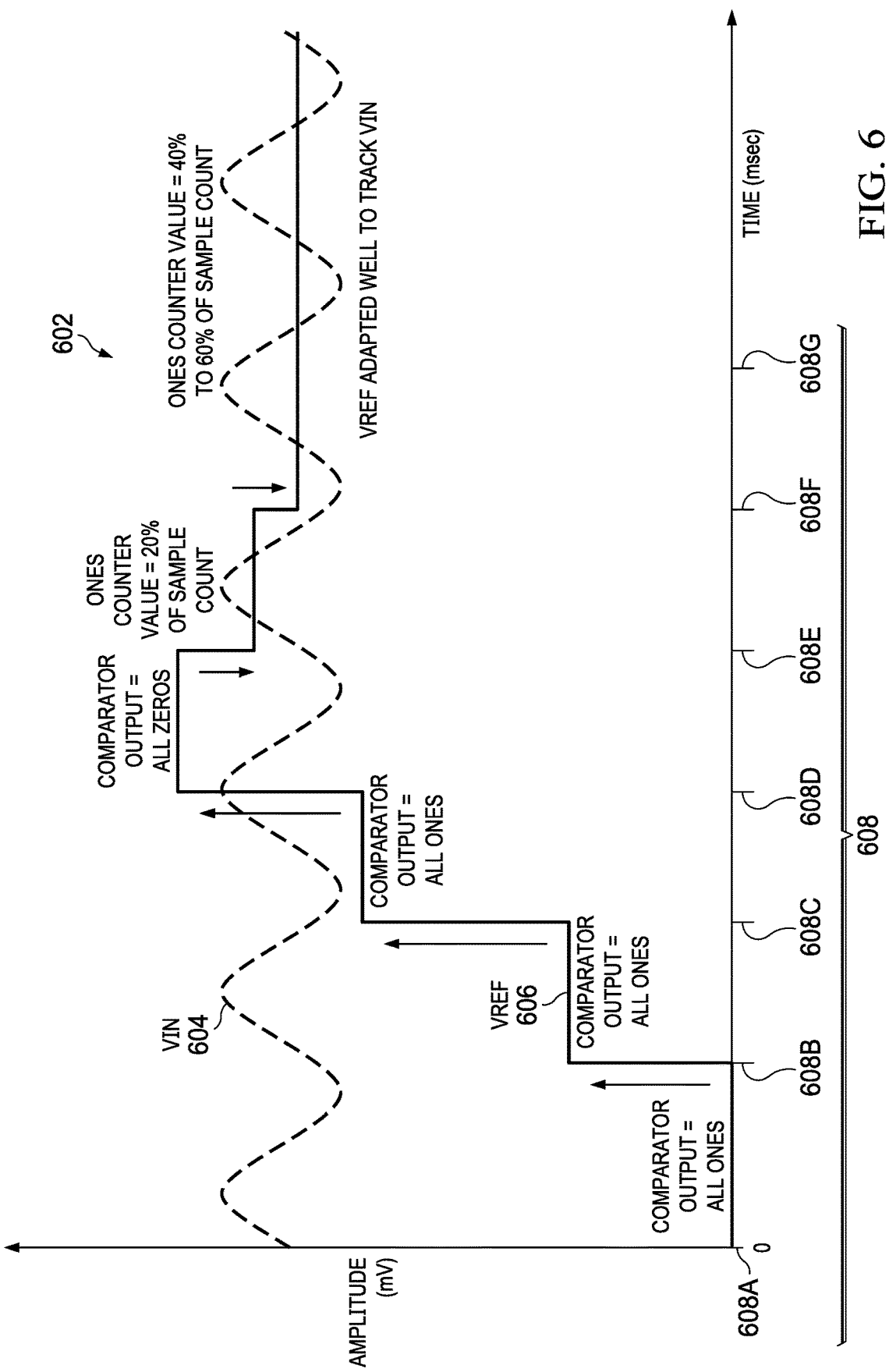
FIG. 6 is a second illustrative example of reference voltage adjustment by the comparator circuitry of FIG. 1.

FIG. 6 is a second illustrative example of reference voltage adjustment by the comparator circuitry of FIG. 1. FIG. 6 includes an example graph 602. The example graph 602 includes an example $V_{IN}$ signal 604, an example $V_{REF}$ signal 606, and example timestamps 608A, 608B, 608C, 608D, 608E, 608F, collectively referred to as example timestamps 608.

Like the example graph 502, the example graph 602 represents time on the x axis in milliseconds and voltage on the y axis in millivolts. The x axis of graph 602 is segmented by example timestamps 608, which also represent the boundaries between sample windows.

The $V_{IN}$ signal 604 is an example implementation of the example input voltage signal 104. The example $V_{IN}$ signal 604 may be generated by any type of test device 102 for any application. In the illustrative example of FIG. 6, the $V_{IN}$ signal 604 is an alternating current (AC) signal with a voltage that oscillates in a sinusoidal pattern over time.

The example $V_{REF}$ signal 606 is an example implementation of the reference voltage provided to the example analog comparator circuitry 204 by the example reference generator circuitry 210. The example graph 602 shows how the amplitude of the example $V_{REF}$ signal 606 changes over time.

Like the example $V_{REF}$ signal 506 in FIG. 5, the example $V_{REF}$ signal 606 starts at zero millivolts and is increased multiple times by the example reference generator circuitry 210 in response to multiple determinations that the amplitude of the $V_{IN}$ signal 604 is greater than the amplitude of the $V_{REF}$ signal 606. The example reference generator circuitry 210 also decreases the amplitude of the example $V_{REF}$ signal 606 in response to determining that amplitude of the $V_{IN}$ signal 604 is less than the amplitude of the $V_{REF}$ signal 606.

Between timestamps 608E, 608F, the amplitude of the example $V_{REF}$ signal 606 is within the range of values through which the example $V_{IN}$ signal 604 oscillates during the same sample period. As a result, the comparator output is at a high supply voltage for only 20% of the samples recorded during the corresponding the sample window. In the illustrative example of FIG. 6, the ones count must be between 40% and 60% of the maximum ones count value (i.e., the total number of samples in a sample window) to satisfy the example comparison threshold range 314. Because the ones count of the sample window between timestamps 608E, 608F does not satisfy the example comparison threshold range 314, the example reference generator circuitry 210 updates the reference voltage again.

The amplitude of the example $V_{REF}$ signal 606 is closer to the average amplitude of the example $V_{IN}$ signal 604 between timestamps 608F, 608G than between timestamps 608E, 608F. As a result, the ones count corresponding to 608F, 608G is within 40% to 60% of the maximum ones count value and satisfies the example comparison threshold range 314.

After the example comparison threshold range 314 is satisfied, the example digital comparator circuitry 312 causes the logic switch circuitry 212 to switch from the disabled state to the enabled state, thereby enabling the example TDC circuitry 216 and TDC analyzer circuitry 218 to characterize the frequency of the example $V_{IN}$ signal 604. The example adaptor circuitry 316 may use previous DAC codes, current DAC codes, and the ones count value between timestamps 608F, 608G to determine one or more of the average amplitude, maximum amplitude, and minimum amplitude of the example $V_{IN}$ signal 604. In such examples, the example adaptor circuitry 316 may provide one or more of the example amplitude parameters to the processor circuitry 108. Furthermore, the example reference generator circuitry 210 does not update the example reference voltage after timestamp 608G because the reference voltage accurately represents the example $V_{IN}$ signal 604.

Figure 7:
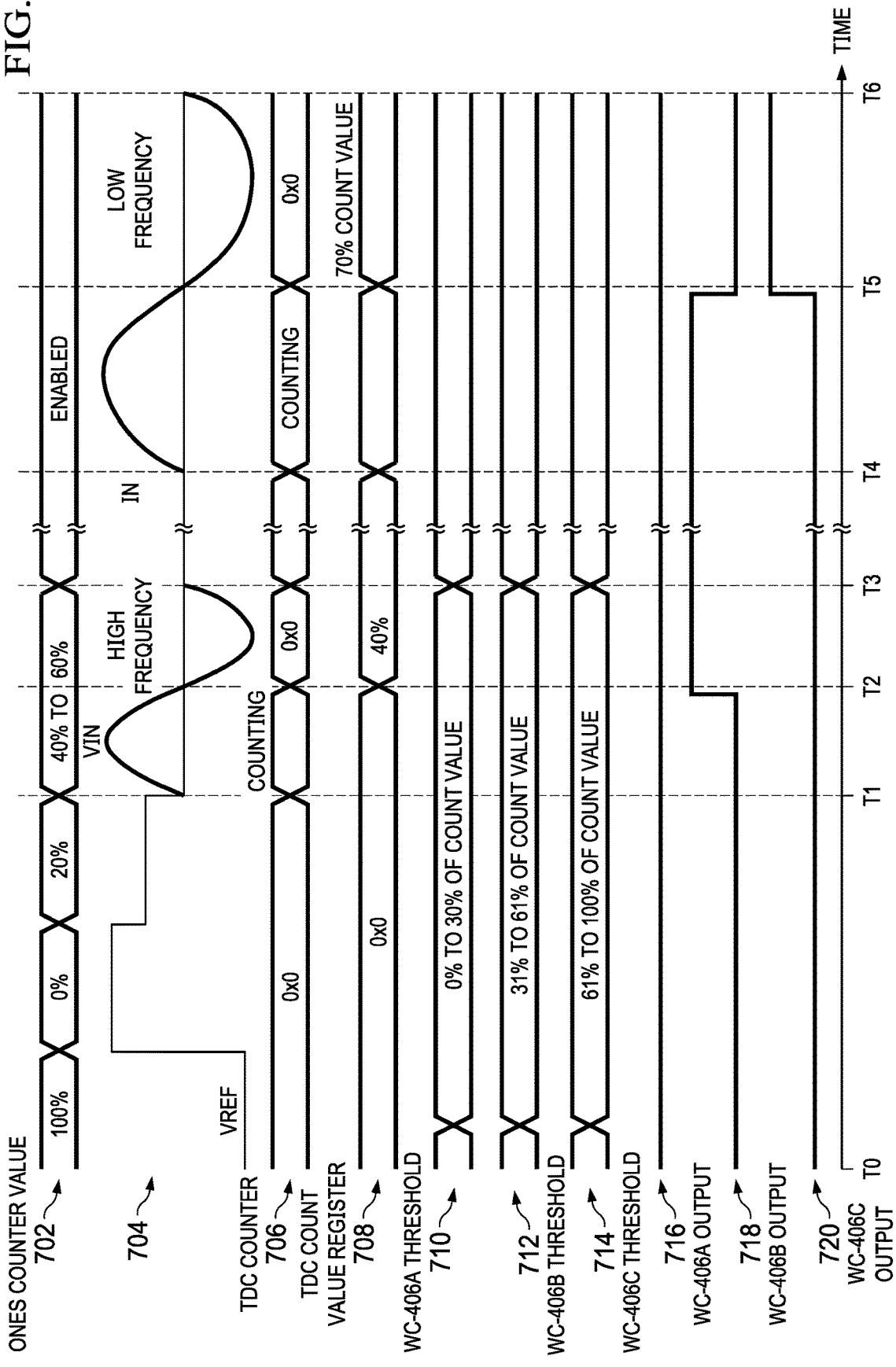
FIG. 7 is an example timing diagram of signals produced by the comparator circuitry of FIG. 1.

FIG. 7 is an example timing diagram of signals produced by the example comparator circuitry 106 of FIG. 1. FIG. 7 includes example signals 702, 704, 706, 708, 710, 712, 714, 716, 718, 720. The example signals 702, 704, 706, 708, 710, 712, 714, 716, 718, 720 are plotted on the same x axis and are aligned vertically with respect to time. The x axis in FIG. 7 includes timestamps T10, T1, T2, T3, T4, T5, T6.

The example signal 702 represents how the ones counter value generated by the example ones counter circuitry 308 changes over time. In the illustrative example of FIG. 7, the ones counter is at 100% of the maximum ones counter value in a first sample window, at 0% of the maximum ones counter value in a second sample window, at 20% of the maximum ones counter value in a third sample window, and is between 40% and 60% of the maximum ones counter value in a fourth sample window.

Because 40% and 60% of the maximum ones counter value define the example comparison threshold range 314 in the illustrative example of FIG. 7, the example digital comparator circuitry 312 enables the logic switch circuitry 212 at T1. Furthermore, in the illustrative example of FIG. 7, the example digital comparator circuitry 312 uses a different, second set of conditions to determine whether to transition the example logic switch circuitry 212 to the disabled state such that the example logic switch circuitry 212 stays enabled at least between T1 and T6.

The example signal 704 overlays an example reference voltage signal and an example input voltage signal. While not illustrated in FIG. 7 for simplicity, the example input voltage reference signal may oscillate at the same high frequency from time T0 to T3. Accordingly, the example reference adaptor circuitry 208 adapts the amplitude of the example reference voltage signal until T1, when the ones counter value is between 40% and 60% of the maximum ones counter value. At T1, the example reference adaptor circuitry 208 causes the example logic switch circuitry 212 to transition to an enable state.

The example signal 706 represents the activity of the example TDC counter circuitry 402 over time. The TDC counter circuitry 402 does not count between T0 and T1 because the example logic switch circuitry 212 is a disable state. The example signal 706 shows that the TDC counter circuitry 402 begins counting between T1 and T2, when the input voltage is greater than the reference voltage in the example signal 704. The example TDC counter circuitry 402 then stops counting between T2 and T3 when the input voltage is less than the reference voltage of signal 704. Similarly, the example signal 706 shows the TDC counter circuitry 402 counts between T4 and T5, and does not count between T5 and T6.

The example signal 708 represents the value stored in the example TDC counter value register 404 over time. Between T0 and T2, the TDC counter value register 404 stores the value zero because the first TDC counter value was not ready for storage until T2. After T2, the example TDC counter value register 404 stores the value of TDC counter value measured between T1 and T2. The example signal 704 shows that, in the illustrative example of FIG. 7, the TDC counter value measured between T1 and T2 in the example signal 702 is 40% of a maximum TDC counter value. A maximum TDC value may be application specific and may be determined by a manufacturer prior to the operation of the example comparator circuitry. Additionally or alternatively, the maximum TDC value may be determined by the number of bits available in a register of the configuration data 214. The maximum TDC value may be determined independently of the maximum ones count value.

In the illustrative example of FIG. 7, the example TDC analyzer circuitry 218 implements three window comparator circuitry 406A, 406B, 406C instances. The example signals 710, 712, 714 illustrate high threshold values and low threshold values that define window comparator circuitry 406A, 406B, 406C, respectively, in the illustrative example of FIG. 7. For example, the signal 710 shows that window comparator circuitry 406A has a lower bound of 0% of the maximum TDC value and an upper bound of 30% of the maximum TDC value. Similarly, the example signal 712 shows that window comparator circuitry 406B has a lower bound of 31% of the maximum TDC value and an upper bound of 60% of the maximum TDC value. The example signal 714 shows that window comparator circuitry 406C has a lower bound of 61% of the maximum TDC value and an upper bound of 100% of the maximum TDC value. In other examples, the TDC analyzer circuitry 218 may be implemented by a different number of window comparator circuitry instances, which may have different lower bounds and upper bounds than those described in connection with FIG. 7.

Example signals 716, 718, 720 show the output of the example window comparator circuitry 406A, 406B, 406C, respectively. Specifically, if the current value stored in the example TDC counter value register 404 is within the upper and lower bounds of a given window comparator, the window comparator will output a high supply voltage representative of a logical '1'. Similarly, if the current value stored in the example TDC counter value register 404 is not within the upper and lower bounds of a given window comparator, the window comparator will output a low supply voltage representative of a logical '0'.

In the illustrative example of FIG. 7, the input voltage in example signal 704 continuously oscillates between the same maximum and minimum voltage values. However, the frequency at which the input voltage of signal 704 oscillates decreases over time. As a result, the period of an nth oscillation is smaller than the period of a subsequent (n+1)th oscillation.

When the example logic switch circuitry 212 is initially enabled, the sample window may be aligned with an oscillation period, causing the ones counter value to satisfy the comparison threshold range 314. For example, suppose one sample window is between T1 and T3, during which the ones counter value is between 40% to 60% of the sample count 310. As the oscillation period changes, the amount of time in one sample window may become misaligned with the amount of time in an oscillation period. Suppose in the foregoing example the time between T4 and T6 is twice as long as the time between T1 and T3. Accordingly, the time between T4 and T6 contains two sample periods. In the sample window between T4 and T5, the ones count value would be 0% of the sample count 310, and the sample window between T5 and T6 is 100% of the sample count 310. However, in the illustrative example of FIG. 7, the example digital comparator circuitry 312 requires n consecutive ones counter values from n consecutive sample windows to each fail to satisfy the comparison threshold range 314 before transitioning the logic switch circuitry 212 to the disabled state. Furthermore, in the illustrative example of FIG. 7, n is sufficiently large such that the logic switch circuitry 212 stays enabled to at least T6.

In other examples, a single set of conditions may be used to control the logic switch circuitry 212 and enable the TDC counter circuitry 402. Suppose the digital comparator circuitry 312 enables the logic switch circuitry 212 whenever the ones counter value is within the comparison threshold range 314 and disables the logic switch circuitry 212 whenever the ones counter value is outside of the comparison threshold range 314. In such examples, a high frequency oscillation of a voltage input signal may have a ones counter value near the lower bound of the comparison threshold range 314 (e.g., 40% of the sample count 310). Similarly, a low frequency oscillation of the same voltage signal may have a ones counter value near the upper bound of the comparison threshold range 314 (e.g., 60% of the sample count 310). In such examples, the example logic switch circuitry 212 may remain enabled while the frequency of the voltage input signal varies, so long as the ones counter value is still within the comparison threshold range 314.

Because the logic switch circuitry 212 stays enabled, the value stored in the example TDC counter value register 404 increases over time. By T5, the example signal 708 shows that the TDC counter value measured between T4 and T5 is 70% of the maximum TDC counter value. The 70% value stored in the example TDC counter value register 404 at T5 causes example window comparator circuitry 406B to transition its output from a logical '1' to a logical '0' and causes example window comparator circuitry 406C to transition its output from a logical '0' to a logical '1'. In turn, the example aggregator circuitry 408 may notify the processor circuitry 108 of the value shift at T5 in example signals 718, 720. Using this information, the processor circuitry 108 determines the frequency of the input voltage in signal 704 has decreased over time. The processor circuitry 108 may also determine whether the decreased frequency is an anomaly. In some examples, the processor circuitry 108 may change the value stored in the example sample count 310 such that a new amount of time in a sample window is more aligned with the decreased frequency.

In some examples, the frequency of an oscillating input voltage signal may be sufficiently low such that the ones count value never satisfies the comparison threshold range 314. A failure to satisfy the comparison threshold range 314 is shown in FIG. 5 with relation to a static DC signal. If the ones counter value repeatedly fails to satisfy the comparison threshold range 314, the processor circuitry 108 may change the sample count 310 to increase the sample window. By doing so, the ones counter value may satisfy comparison threshold range 314 in future sample windows. In examples where the counter value satisfies the comparison threshold range 314 after one or more changes to the sample window, the example processor circuitry 108 can identify that the input voltage is an oscillating AC signal rather than a static DC signal.

Figure 8:
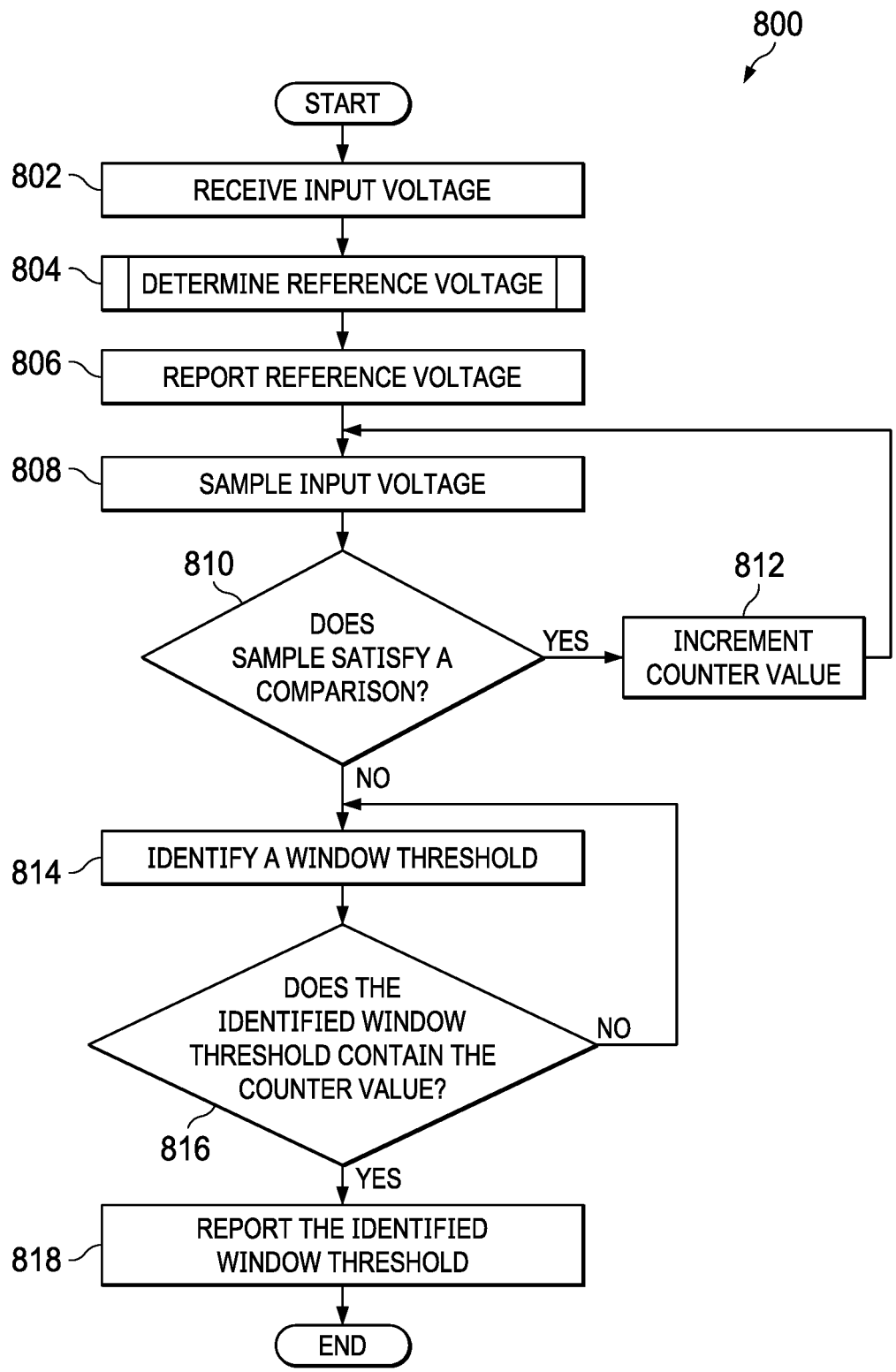
FIG. 8 is a flowchart representative of an example process that may be performed using machine readable instructions that can be executed and/or hardware configured to implement the comparator circuitry of FIG. 1 to report voltage amplitudes and frequencies.

FIG. 8 is a flowchart representative of an example process that may be performed using machine readable instructions that can be executed and/or hardware configured to implement the example comparator circuitry 106 of FIG. 1. The example machine readable instructions and/or operations 800 begins when the example analog comparator circuitry 204 receives an input voltage signal 104. (Block 802.) The example input voltage signal 104 may be from any type of test device 102 and may be used in any application. The example analog comparator circuitry 204 may receive the input voltage signal 104 from the test device 102 through any appropriate medium, including but not limited to wired communication protocols such as Ethernet, Universal Serial Bus (USB), etc., and wireless communication protocols such as WiFi, Bluetooth, Near Field Contact (NFC), etc.

The example amplitude analysis circuitry 202 determines a reference voltage. (Block 804.) The determined reference voltage may represent an exact or an average value of the input voltage. Block 804 is discussed further in connection with FIG. 9.

The example reference adaptor circuitry 208 reports the reference voltage to the example processor circuitry 108. (Block 806.) To report the reference voltage, the example adaptor circuitry 316 may provide a DAC code to the example processor circuitry 108 via an interrupt or status update. In such examples, the DAC code may be included in an interrupt, status update, or similar indication sent by the example adaptor circuitry 316 to the example processor circuitry 108.

The example TDC circuitry 216 samples the comparator output signal. (Block 808.) The example TDC circuitry 216 may sample the input voltage based on a reference signal provided by external clock circuitry.

The example TDC circuitry 216 determines whether the sample satisfies a comparison. (Block 810.) In some examples, the sample may satisfy the comparison when the input voltage is greater than the reference voltage. In other examples, the sample may satisfy the comparison when the input voltage is less than or equal to the reference voltage.

If the sample satisfies the comparison (Block 810: Yes), the example TDC circuitry 216 increments a counter value. (Block 812.) The example machine readable instructions and/or operations 800 continue to block 808 after block 808, where the example TDC circuitry 216 records a new sample of the input voltage.

If the sample does not satisfy the comparison (Block 810: No), the example aggregator circuitry 408 identifies a window threshold. (Block 814.) For example, the aggregator circuitry 408 may identify an upper bound value and lower bound value from one of the example window comparator circuitry 406A, 406B, . . . , 406-n instances.

The example aggregator circuitry 408 determines whether the identified window threshold contains the counter value. (Block 816.) For example, the example aggregator circuitry 408 may check the output of the identified window comparator circuitry (e.g., window comparator circuitry 406A). An output of a logical '1' from the identified window comparator circuitry may indicate the counter value is both (1) less than or equal to an upper bound value and (2) greater or equal to a lower bound value.

If the identified window threshold does not contain the counter value (Block 816: No), the example machine readable instructions and/or operations 800 continue to block 814, where the aggregator circuitry 408 identifies a different window threshold (e.g., the upper and lower bounds of window comparator circuitry 406B).

If the identified window threshold contains the counter value (Block 816: Yes), the example aggregator circuitry 408 reports the identified window threshold to the example processor circuitry 108. The reported window threshold, which contains the counter value, is the last set of upper and lower bound values identified at block 814. The example machine readable instructions and/or operations 800 end after block 818.

Figure 9:
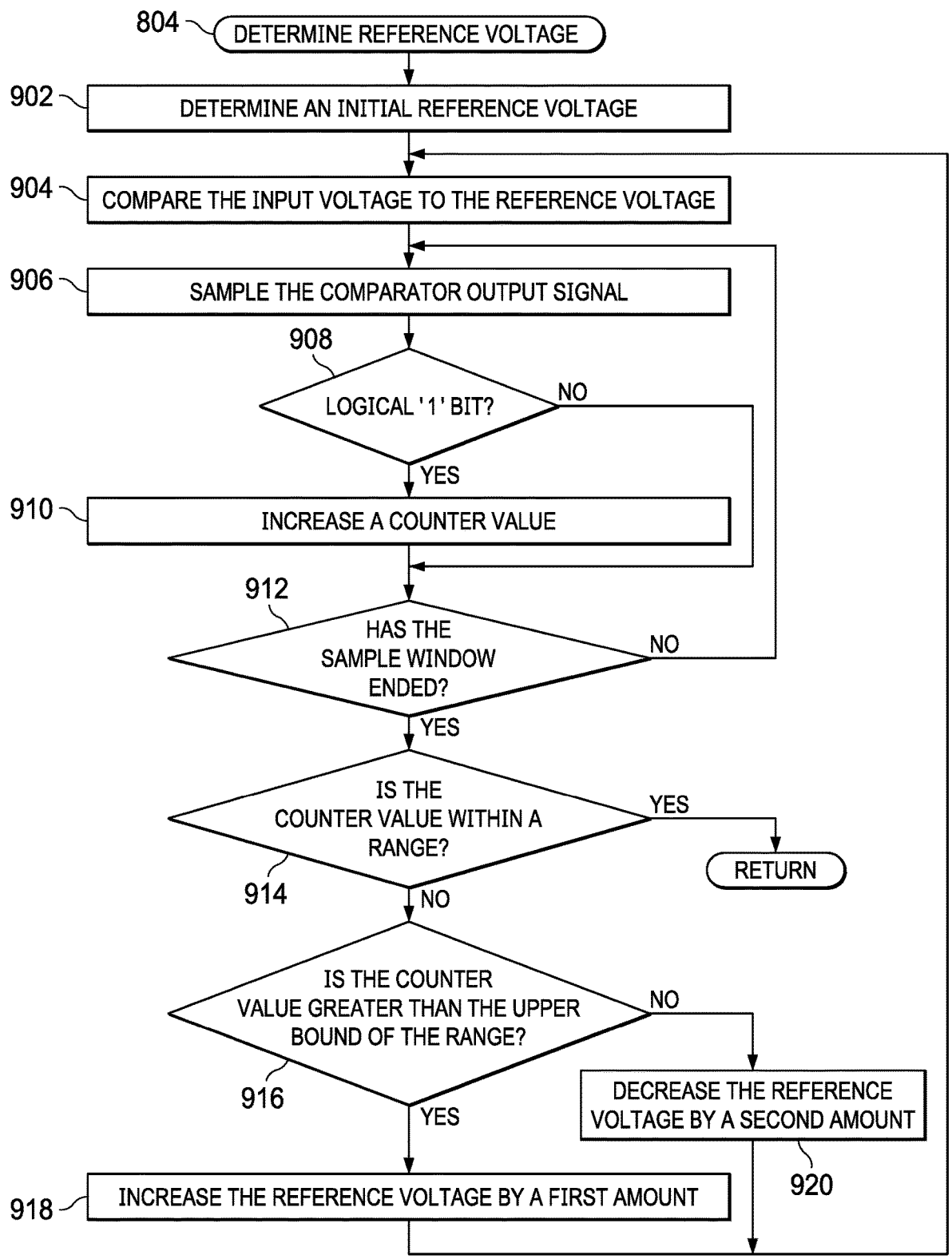
FIG. 9 is a flowchart representative of an example process that may be performed using machine readable instructions that can be executed and/or hardware configured to implement the comparator circuitry of FIG. 1 to determine a reference voltage as described in FIG. 8.

FIG. 9 is a flowchart representative of an example process that may be performed using machine readable instructions that can be executed and/or hardware configured to implement the comparator circuitry of FIG. 1 to determine a reference voltage as described in FIG. 8. Specifically, FIG. 9 describes how the example machine readable instructions and/or operations 800 may implement block 804 of FIG. 8.

Execution of block 804 begins when the example reference generator circuitry 210 determines an initial reference voltage. (Block 902.) The initial reference voltage may be based on a supply voltage and an initial DAC code, as described previously. In some examples, the initial reference voltage may be zero volts.

The example analog comparator circuitry 204 compares the input voltage to the reference voltage. (Block 904.) For example, the analog comparator circuitry 204 may produce a comparator output signal that is a logical '1' when the input voltage is greater than the reference voltage and that is a logical '0' when the input voltage is less than or equal to the reference voltage.

The example digital sampler circuitry 306 samples the comparator output signal. (Block 906.) The example digital sampler circuitry 306 samples the comparator output signal at a rate provided by the clock divider circuitry 302. The digital sampler circuitry 306 may output a logical '1' bit when the comparator output signal is at a high supply voltage. Similarly, the digital sampler circuitry 306 may output a logical '0' bit when the comparator output signal is at a low supply voltage.

The example ones counter circuitry 308 determines whether the output of the example digital sampler circuitry is a logical '1' bit. (Block 908.) If the output is a logical '1' bit (Block 908: Yes), the example ones counter circuitry 308 increases a counter value. (Block 910.) Specifically, the example ones counter circuitry 308 increases the ones counter value, which has a maximum value of the sample count 310. The ones counter value may be determined independently of the TDC counter value described in block 812.

If the output of the example digital sampler circuitry is a logical '0' bit (Block 908: No), the example ones counter circuitry 308 determines whether the sample window has ended. (Block 912.) The example machine readable instructions and/or operations 800 may alternatively implement block 912 after the ones counter value is incremented in block 910. The example ones counter circuitry 308 may determine when the sample window has ended based on the sample count 310. For example, if the sample count 310 stores the value n, then the sample window ends once the example ones counter circuitry 308 obtains n consecutive samples from the digital sampler circuitry 306. If the sample window has not ended (Block 912: No), the example machine readable instructions and/or operations 800 continue to block 906, where the example digital sampler circuitry 306 records another sample of the comparator output signal.

If the sample window has ended (Block 912: Yes), the example digital comparator circuitry 312 determines whether the counter value is within a range. (Block 914.) For example, the digital comparator circuitry 312 may implement block 914 by determining whether the counter value is both (1) less than or equal to an upper bound value and (2) greater or equal to a lower bound value of the example comparison threshold range 314. If the counter value is within the range (Block 914: Yes), the example machine readable instructions and/or operations 800 return to block 806.

If the counter value is not within the range (Block 914: No), the example adaptor circuitry 316 determines whether the counter value is greater than the upper bound of the range. (Block 916.) If the counter value is greater than the upper bound of the range (Block 916: Yes), the example adaptor circuitry 316 increases the reference voltage by a first amount. (Block 918.) To increase the reference voltage, the example adaptor circuitry 316 may add the forward adaption step size 318 to a DAC code and provide the updated DAC code to the example reference generator circuitry 210, which uses the code to generate a new reference voltage with a greater amplitude than the previous iteration. After block 918, the example machine readable instructions and/or operations 800 continue to block 904, where the example analog comparator circuitry 204 compares the input voltage to the new reference voltage.

If the counter value is less than the upper bound of the range (Block 916: No), the example adaptor circuitry 316 decreases the reference voltage by a second amount. (Block 920.) To decrease the reference voltage, the example adaptor circuitry 316 may subtract the backward adaption step size 320 to a DAC code and provide the updated DAC code to the example reference generator circuitry 210, which uses the code to generate a new reference voltage with a smaller amplitude than the previous iteration. After block 920, the example machine readable instructions and/or operations 800 continue to block 904, where the example analog comparator circuitry 204 compares the input voltage to the new reference voltage.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the cost, power, and time requirements to characterize voltage amplitude and frequency for anomaly detection. Advantageously, the example comparator circuitry 106 may provide amplitude characteristics such as a minimum, maximum, and/or average voltage amplitude to the processor circuitry 108 without the use of a high-resolution ADC. The example comparator circuitry 106 may also describe how the amplitude of an input voltage changes over time by adjusting a comparison reference voltage. Furthermore, the example comparator circuitry 106 also provides frequency characteristics to the processor circuitry 108 without specialized signal processing techniques such as an FFT.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. A device to compare voltages, the device comprising:
analog comparator circuitry having a first input configured to couple to an input voltage and a second input configured to couple to a reference voltage, the analog comparator circuitry configured to output a digital value corresponding to a difference between the input voltage and the reference voltage;

output sampler circuitry configured to:
produce a plurality of samples of the difference; and
count a number of the plurality of samples in which the input voltage is greater than the reference voltage; and
reference adaption circuitry configured to:
determine, based on the count, whether to adjust the reference voltage;
responsive to a determination to adjust the reference voltage, determine, based on the count, an amount of adjustment; and
responsive to a determination not to adjust the reference voltage, provide an indication of the reference voltage to processor circuitry.

2. The device of claim 1, wherein:
the reference voltage is an initial reference voltage;
the plurality of samples is a first plurality of samples produced during a first sample window;
in response to a determination to adjust the initial reference voltage:
the reference adaption circuitry is further configured to produce an updated reference voltage based on the amount of adjustment;
the analog comparator circuitry is further configured to transition from a first output based on the initial reference voltage to a second output based on the updated reference voltage; and
the output sampler circuitry is further configured to produce a second plurality of samples based on the second output of the analog comparator circuitry.

3. The device of claim 1, wherein to determine whether to adjust the reference voltage, the reference adaption circuitry is further configured to determine whether the count is (a) greater than a first value, (b) less than a second value, or (c) within a range of values defined by the first value and second value.

4. The device of claim 3, wherein:
responsive to a determination that the count is greater than the first value, the reference adaption circuitry is further configured to adjust the reference voltage by increasing the reference voltage a first amount; and
responsive to a determination that the count is less than the second value, the reference adaption circuitry is further configured to adjust the reference voltage by decreasing the reference voltage a second amount.

5. The device of claim 4, wherein the processor circuitry is configured to determine one or more of the first value, the second value, the first amount, and the second amount.

6. The device of claim 3, wherein, responsive to a determination that the count is within the range of values, the reference adaption circuitry is further configured to not adjust the reference voltage.

7. The device of claim 1, further including:
first window comparator circuitry configured to, responsive to a determination not to adjust the reference voltage, determine whether the count is within a first window defined by a first threshold value and a second threshold value; and
second window comparator circuitry configured to, responsive to a determination to not to adjust the reference voltage, determine whether the count is within a second window defined by a third value and a fourth value.

8. The device of claim 7, further including aggregator circuitry to, responsive to the count being within either the first window or the second window, provide an indication to the processor circuitry.

9. The device of claim 8, wherein the processor circuitry is configured to:
detect an anomaly based on the indication; and
provide a control signal based on the anomaly.

10. A device to compare voltages, the device comprising:
amplitude analysis circuitry configured to:
receive an input voltage;
generate a comparator signal based on the input voltage to a reference voltage;
update the reference voltage based on the comparator signal; and
provide an indication of the reference voltage to processor circuitry;
time to digital converter (TDC) circuitry configured to, responsive to a determination that the comparator signal indicates the input voltage is greater than the reference voltage, increment a counter value;
TDC analyzer circuitry configured to provide the counter value to the processor circuitry; and
the processor circuitry configured to detect an anomaly based on one or more of the reference voltage and the counter value.

11. The device of claim 10, wherein to provide the counter value to the processor circuitry, the TDC analyzer circuitry further includes:
a plurality of ranges, the respective ranges including an upper bound value and a lower bound value; and
aggregator circuitry configured to:
identify a range from the plurality of ranges that contains the counter value; and
provide the range to the processor circuitry.

12. The device of claim 10, further including switch circuitry configured to:
provide, in an enabled state, the comparator signal to the TDC circuitry; and
prevent, in a disabled state, the TDC circuitry from incrementing the counter value.

13. The device of claim 12, wherein the amplitude analysis circuitry is further configured to:
sample the comparator signal a plurality of times during a sample window;
identify a subset of samples from the sample window that indicate the input voltage is greater than the reference voltage; and
responsive to a determination that a number of samples within the subset is within a threshold range, cause the switch circuitry to transition from the disabled state to the enabled state.

14. The device of claim 13, wherein:
the plurality of times is a first plurality;
the sample window is a first sample window;
the subset of samples is a first subset of samples; and
amplitude analysis circuitry is further configured to:
sample the comparator signal a second plurality of times during a second sample window;
identify a second subset of samples from the second sample window that indicate the input voltage is greater than the reference voltage; and
responsive to a determination that a number of samples within the second subset is outside a threshold range cause the switch circuitry to transition from the enabled state to the disabled state.

15. The device of claim 12, wherein to update the reference voltage, the amplitude analysis circuitry is further configured to:
sample the comparator signal a plurality of times during a sample window;

identify a subset of samples from the sample window that indicate the input voltage is greater than the reference voltage;

responsive to a determination that a number of samples within the subset is above a threshold range, increase the reference voltage by a first amount; and responsive to a determination that a number of samples within the subset is below the threshold range, decrease the reference voltage by a second amount.

16. A method to compare voltages, the method comprising:

receiving an input voltage;

generating a comparator signal based on the input voltage to a reference voltage;

updating the reference voltage based on the comparator signal;

providing the reference voltage to processor circuitry;

responsive to a determination that the comparator signal indicates the input voltage is greater than the reference voltage, incrementing a counter value;

providing the counter value to the processor circuitry; and detecting, with the processor circuitry, an anomaly based on one or more of the reference voltage and the counter value.

17. The method of claim 16, further including:

a plurality of ranges, the respective ranges including an upper bound value and a lower bound value;

identifying a range from the plurality of ranges that contains the counter value; and providing the range to the processor circuitry.

18. The method of claim 16, further including:

permitting, with switch circuitry in an enabled state, incrementing the counter value; and preventing, with switch circuitry in a disabled state, incrementing the counter value.

19. The method of claim 18, further including:

sampling the comparator signal a plurality of times during a sample window;

identifying a subset of samples from the sample window that indicate the input voltage is greater than the reference voltage; and responsive to a determination that a number of samples within the subset is within a threshold range, transitioning the switch circuitry from the disabled state to the enabled state.

20. The method of claim 16, wherein updating the reference voltage further includes:

sampling the comparator signal a plurality of times during a sample window;

identifying a subset of samples from the sample window that indicate the input voltage is greater than the reference voltage;

responsive to a determination that a number of samples within the subset is above a threshold range, increasing the reference voltage by a first amount; and responsive to a determination that a number of samples within the subset is below the threshold range, decreasing the reference voltage by a second amount.

* * * * *